(12) United States Patent
Buurman et al.

(10) Patent No.: US 7,491,478 B2
(45) Date of Patent: Feb. 17, 2009

(54) LITHOGRAPHIC APPARATUS AND DEVICE MANUFACTURING METHOD

(75) Inventors: Erik Petrus Buurman, Veldhoven (NL); Jozef Maria Finders, Veldhoven (NL); Alexander Straaijer, Eindhoven (NL); J. W. De Klerk, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 753 days.

(21) Appl. No.: 10/897,398

(22) Filed: Jul. 23, 2004

(65) Prior Publication Data

US 2006/0017906 A1  Jan. 26, 2006

(51) Int. Cl.
*G03F 9/00* (2006.01)
*G03C 5/00* (2006.01)

(52) U.S. Cl. .................. 430/30; 430/311; 430/322

(58) Field of Classification Search .......... 430/30, 430/311, 322
See application file for complete search history.

(56) References Cited

U.S. PATENT DOCUMENTS

| 6,724,462 B1 | 4/2004 | Singh et al. | |
| 2001/0026448 A1 | 10/2001 | Koizumi et al. | 362/268 |

FOREIGN PATENT DOCUMENTS

| JP | 09199403 | * 7/1997 | .......... 430/30 |

OTHER PUBLICATIONS

K. Boller et al., "Investigation of Carbon Contamination of Mirror Surfaces Exposed to Synchrotron Radiation", Nuclear Instruments and Methods 208 (1983), pp. 273-279.

Reena Banga et al., "FTIR and AFM Studies of the Kinetics and Self-Assembly of Alkyltrichlorosilanes and (Perfluoroalkyl) trichlorosilanes into Glass and Silicon", *Langmuir*, 1995, vol. 11, No. 11, pp. 4393-4399.

J. B. Brzoska et al., "Silanization of Solid Substrates: A Step Toward Reproducibility", *Langmuir*, 1994, vol. 10, No. 11, pp. 4367-4373.

Atul N. Parikh et al., "An Intrinsic Relationship between Molecular Structure in Self-Assembled n-Alkylsiloxane Monolayers and Deposition Temperature", *The Journal of Physical Chemistry.*, 1994, vol. 98, No. 31, pp. 7577-7590.

Uthara Srinivasan et al. "Alkyltrichlorosilane-Based Self-Assembled Monolayer Films for Stiction Reduction in Silicon Micromachines", Journal of Microelectromechanical Systems, Jun. 1998, vol. 7., No. 2, pp. 252-260.

P.F. Man et al., "Elimination of Post-Release Adhesion in Microstructures Using Thin Conformal Fluorocarbon Films", Proceedings IEEE Micro Electro Mechanical Systems Workshop, San Diego, CA, 1996, pp. 55-60.

* cited by examiner

*Primary Examiner*—Christopher G Young
(74) *Attorney, Agent, or Firm*—Pillsbury Winthrop Shaw Pittman LLP

(57) ABSTRACT

Control of exposures is based at least in part on the relative contrast loss for a source spectrum and an pattern to be projected or an average absolute detuning of the source.

21 Claims, 2 Drawing Sheets

US 7,491,478 B2

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Most lithographic apparatus are designed to be used with a radiation source that is as near monochromatic as possible. However, no radiation source can be perfectly monochromatic—the emitted radiation will have a certain spectral width which will affect the quality of the projected image since the projection and other optical systems will be chromatic. The spectral width of the source will also vary over time in ways that are not entirely predictable. For example, the spectral width of the output of a laser will vary due, for example, to thermal effects, to acoustic and resonant effects which depend on pulse repetition rate and due to aging of optical and electronic components. It is desirable therefore to monitor the spectral width of the source output so that appropriate control action can be taken. Such control is facilitated if the source spectrum can be represented by a single value. Known parameters of the source spectrum that are used for control in lithographic apparatus are the FWHM value and the E95 value. The FWHM (Full Width Half Maximum) value is the distance between the two points in the spectrum that have half the intensity of the peak. The E95 value is the width of the spectral peak that contains 95% of the energy of the peak and can be obtained by integrating the source spectrum and taking the distance between the points at which the integrated intensity is 2.5% and 97.5% of the total. FWHM and E95 are shown in FIG. 2 of the accompanying drawings, which shows intensity and integrated intensity vs. wavelength for an example of a spectral peak of a laser source. However, neither FWHM nor E95 is ideal as a parameter in all circumstances.

SUMMARY

In particular instances, it may be desirable to have alternative or additional parameters representing the spectral width of a source for use in control of lithographic apparatus.

According to an aspect of the invention, a lithographic projection apparatus is arranged to project a pattern from a patterning device onto a substrate using a radiation beam derived from a source, the radiation beam having a spectrum, and the apparatus having a control device arranged to determine the relative contrast loss for the spectrum and the pattern to be transferred. The projection of said pattern is controlled on the basis of the determined relative contrast loss, which is a function of the spectrum of the radiation beam, the pattern to be imaged and settings of the apparatus to be used during projection of the pattern.

A further aspect of the invention provides a device manufacturing method comprising projecting a patterned beam of radiation onto a substrate, wherein control of the projection is performed at least partially on the basis of the relative contrast loss, and the relative contrast loss is a function of the spectrum of the radiation beam, the pattern to be imaged and settings to be used during projection of the pattern.

In an embodiment of the invention, the relative contrast loss (RCL) is given by:

$$RCL = 1 - \int_\lambda C(\lambda) \times S(\lambda) d\lambda$$

where $S(\lambda)$ is the normalized spectrum of said beam, $C(\lambda)$ is the normalized contrast function and $\lambda$ is wavelength.

In another embodiment of the invention the normalized contrast function is given by:

$$C(\lambda) = C_0 \times \sin(\alpha\lambda)/(\alpha\lambda) \times \exp(-\beta\lambda^2)$$

where $\alpha$ and $\beta$ are constants determined by the pattern to be imaged, the Numeric Aperture of the projection system of said apparatus and the a setting for the projection of said pattern.

Another aspect of the invention provides a lithographic projection apparatus arranged to project a pattern from a patterning device onto a substrate using a radiation beam derived from a source, the radiation beam having a spectrum, and the apparatus having a control device arranged to determine the average absolute detuning for the spectrum and to control the projection of the pattern on the basis of the determined relative contrast loss.

A further aspect of the invention provides a device manufacturing method comprising projecting a patterned beam of radiation onto a substrate, wherein control of the projection is performed at least partially on the basis of the relative contrast loss, and the relative contrast loss is a function of the spectrum of the radiation beam, the pattern to be imaged and settings to be used during projection of the pattern.

In an embodiment of the invention, the average absolute detuning (AAD) is given by:

$$AAD = \int_\lambda |\lambda| \cdot S(\lambda) d\lambda$$

where $S(\lambda)$ is the normalized spectrum of said beam and $\lambda$ is wavelength.

Another aspect of the invention provides a device manufacturing method comprising projecting a patterned beam of radiation onto a substrate, wherein control of the projection is performed at least partially on the basis of the average absolute detuning of the spectrum of said radiation beam In an embodiment of the invention, during projection of the pattern, the substrate is inclined to the best image plane and the inclination of the substrate is reduced when the relative contrast loss increases.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
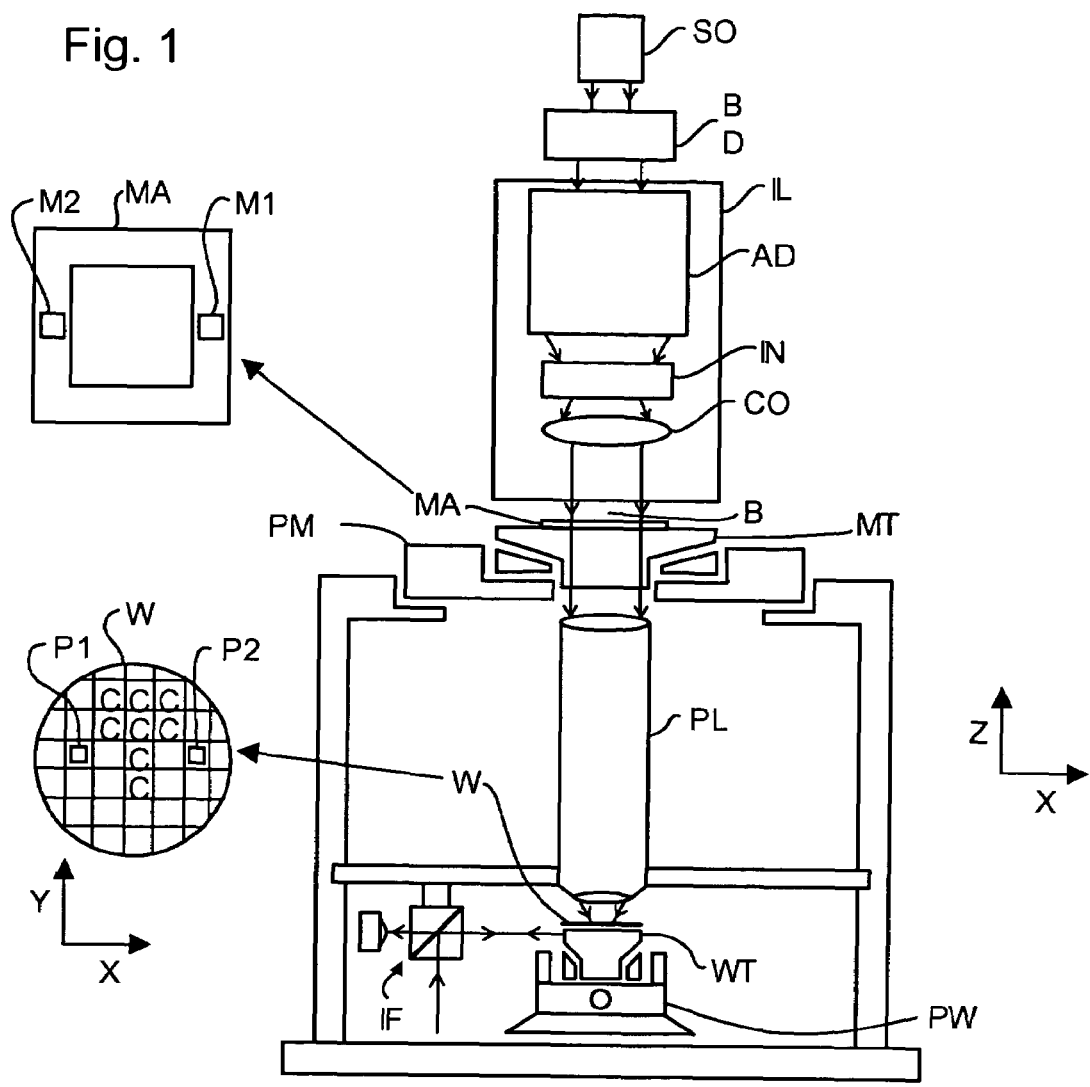
FIG. 1 depicts a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam B (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Because the projection system is not perfectly achromatic, the finite width of the source bandwidth will result in a smearing of the projected image since not all wavelengths will be focused on the exact same spot. This smearing manifests itself in the final device as an increase in critical dimension (CD) and may also be pitch dependent, i.e. the critical dimension for isolated lines is different than that for dense lines. Variation of the smearing effect across a target portion or substrate can occur if the spectrum of the source changes during the course of an exposure or a series of exposures. Even though the bandwidth of the source may be of the order of picometers ($10^{-9}$ m) this effect is significant in lithography.

To increase CD uniformity across each target portion and substrate, the substrate table is inclined relative to the best image plane for the nominal wavelength of the source. This gives a smearing effect similar to that due to the finite source bandwidth. If the source bandwidth varies so as to increase the bandwidth smearing, the tilt can be reduced to compensate and maintain a constant CD, and vice versa. Given a uniform CD across the substrate, the processing of the exposed substrate can be adjusted accordingly to give the desired line width, etc. More generally, the present invention can make use of any parameter that affects iso-dense bias to introduce a compensation for source spectrum variation as measured by the novel metrics described herein. Other possibilities include illumination settings such as σ and projection system settings such as spherical aberration. Combinations of different parameters may also be used in control. Changes in the source bandwidth may also induce a change in depth of focus which can be predicted by the invention and compensated for in known ways.

Determination of the amount by which the tilt must be changed requires the source bandwidth to be parameterized. The present invention proposes two possibilities for this—relative contrast loss and average absolute detuning.

The relative contrast loss (RCL) can be defined as:

$$RCL = 1 - \int_\lambda C(\lambda) \times S(\lambda) d\lambda \qquad (1)$$

where $S(\lambda)$ the normalized laser spectrum, and $C(\lambda)$ is the normalized contrast function. $C(\lambda)$ is determined by the lens design, the lithographic structure which is imaged and the illumination setting.

The contrast function C(lambda) is derived as follows. First the contrast through focus is calculated using lithography simulation software such as Prolith™ (available from KLA-Tencor Corporation, San Jose, Calif.) or Solid-C™ (available from Sigma-C GmbH, Munich, Germany). Inputs to this calculation are NA, illumination mode (sigma), wavelength, CD, pitch, and the type of mask (binary, phase shifted, etc.). Given the focus dependency on wavelength of the projection lens, the contrast through focus result, which is derived from the simulation calculation, can be transformed into a contrast through wavelength result. The resulting contrast versus wavelength ($C(\lambda)$) can be used directly in the calculation of the relative contrast loss as in Equation (1).

Alternatively, it may be more convenient to fit an analytical function to the calculated data. An example of a function which can be used is the function given in equation 2. The constants alpha and beta are then derived from the fit of the function to the calculated numbers.

$$C(\lambda)=C_0 \times \sin(\alpha\lambda)/(\alpha\lambda) \times \exp(-\beta\lambda^2) \qquad (2)$$

The Average Absolute Detuning (AAD) is the weighed average detuning distance of the spectrum with respect to the centre of gravity of the spectrum and can be given by:

$$AAD = \int_\lambda |\lambda| \cdot S(\lambda) d\lambda \qquad (3)$$

where $S(\lambda)$ is the normalized laser spectrum.

Figure 3:
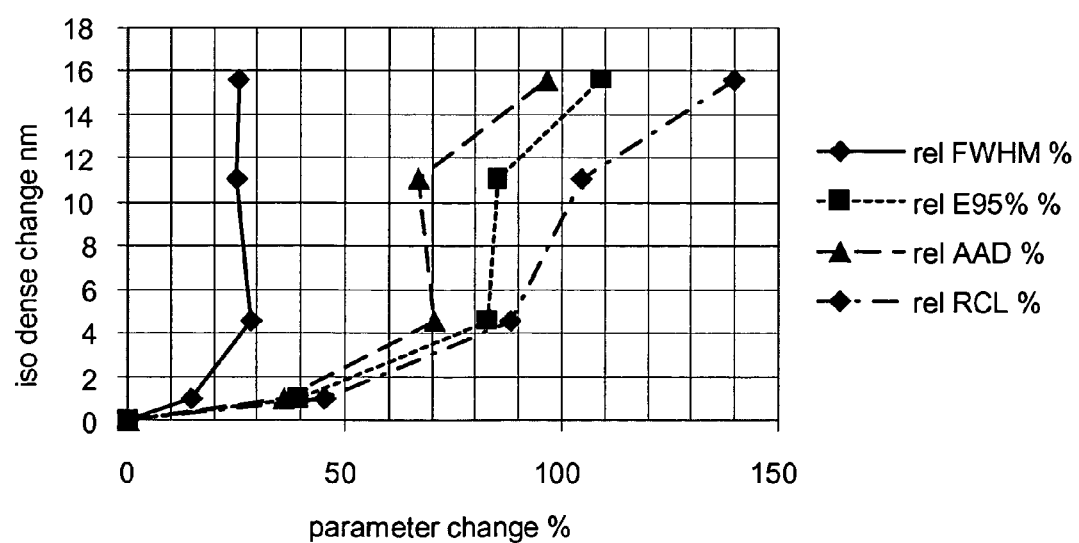
FIG. 3 is a graph of CD variation with pitch for different source spectra as measured by different parameters.

FIG. 3 shows the CD difference between isolated and dense lines for five different source spectra and the corresponding relative values of the parameters FWHM, E95, AAD and RCL. This graph shows that RCL is the measure of source bandwidth most useful for predicting the effect on CD uniformity. Since RCL is in part dependent on the pattern to be imaged and illumination settings, in some cases AAD may be used as an alternative measure, involving less calculation and in particular is more suited to use for internal control in the source.

Figure 4:
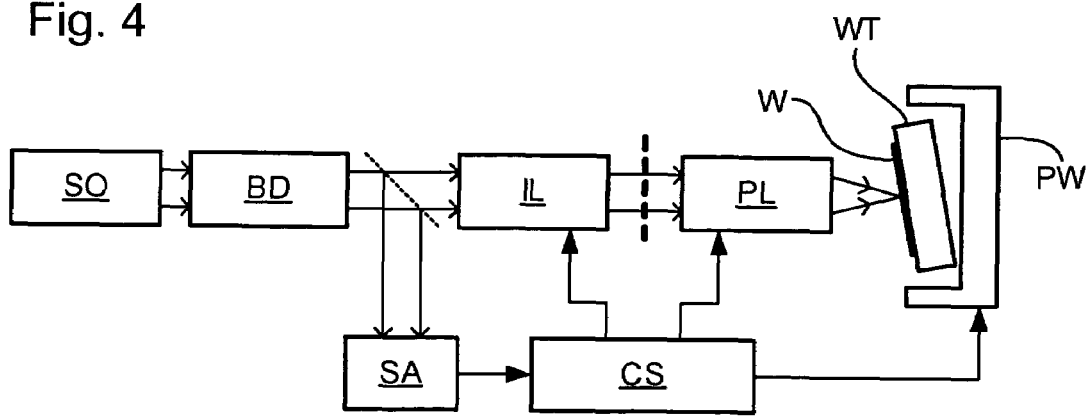
FIG. 4 depicts a control system according to the invention.
Figure 2:
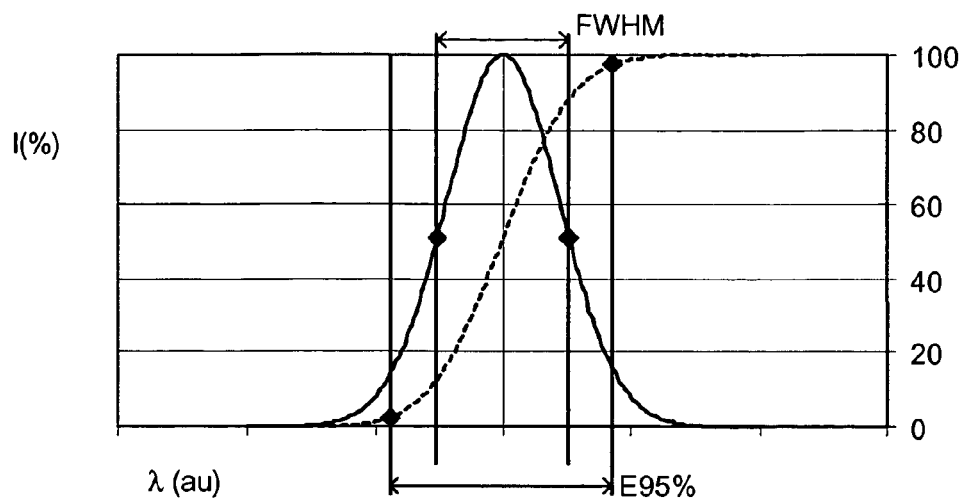
FIG. 2 is an example of a spectrum of the output of a radiation source showing definitions of FWHM and E95 parameters

A control system according to an embodiment of the invention is shown in FIG. 4. The source SO, e.g. an excimer laser, outputs a radiation beam B which is delivered to the illuminator IL by beam delivery BD. At a convenient point, which may be between modules or within one of the above mentioned modules, a portion of the beam is diverted to a spectrum analyser which measures the spectrum of the radiation beam and passes this information to the controller CS. Controller CS determines the value of the control parameter, e.g. relative contrast loss or average absolute detuning, and makes an estimate of the bandwidth-induced smearing that will occur. The substrate table WT is then set to an appropriate angle so that the sum of the tilt-induced smearing and the bandwidth-induced smearing is constant. This control may be carried out on a real time, per target portion or per substrate basis and is of course combined with other controls. Controller CS may be embodied as a part of the control software of the apparatus and may be executed on a general-purpose computer system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A device manufacturing method comprising:
   patterning a beam of radiation with a pattern, said radiation having a spectrum;
   projecting the patterned beam of radiation onto a substrate;
   determining a relative contrast loss as a function of the spectrum, the pattern and settings to be used during projection of the pattern, the relative contrast loss (RCL) determined by:

$$RCL = 1 - \int_\lambda C(\lambda) \times S(\lambda) d\lambda$$

where $S(\lambda)$ is a normalized spectrum of the radiation, $C(\lambda)$ is a normalized contrast function and $\lambda$ is wavelength of the radiation; and
   controlling the projection at least partially on the basis of the relative contrast loss.

2. A method according to claim 1 wherein said normalized contrast function is given by:

$$C(\lambda)=C_0 \times \sin(\alpha\lambda)/(\alpha\lambda) \times \exp(-\beta\lambda^2)$$

where $\alpha$ and $\beta$ are constants determined by the pattern, a numeric aperture of a projection system used in the projecting and a $\sigma$ setting used during the method.

3. A method according to claim 1 further comprising:
   inclining the substrate to a best image plane during the projecting.

4. A method according to claim 3 further comprising:
   reducing the inclining when said relative contrast loss increases.

5. A method according to claim 1 wherein during the projecting, a sigma setting of an illuminator used in performing the method is controlled at least partly on the basis of the relative contrast loss.

6. A method according to claim 1 wherein during the projecting, spherical aberrations of a projection system used in performing the method are controlled at least partly on the basis of the relative contrast loss.

7. A device manufacturing method comprising:
projecting a patterned beam of radiation onto a substrate;
controlling the projecting at least partially on the basis of an average absolute detuning of a spectrum of said patterned beam, the average absolute detuning (AAD) given by:

$$AAD = \int_\lambda |\lambda| \cdot S(\lambda) d\lambda$$

where $S(\lambda)$ is the normalized spectrum of the radiation and $\lambda$ is wavelength of the radiation.

8. A method according to claim 7 further comprising:
inclining the substrate to a best image plane during the projecting.

9. A method according to claim 8, further comprising:
reducing the inclining when said average absolute detuning increases.

10. A method according to claim 7 wherein during the projecting, a sigma setting of an illuminator used in performing the method is controlled at least partly on the basis of the average absolute detuning.

11. A method according to claim 7 wherein during the projecting, spherical aberrations of a projection system used in performing the method are controlled at least partly on the basis of the average absolute detuning.

12. A machine readable storage medium having stored machine executable instructions for performing a method comprising:
projecting a patterned beam of radiation onto a substrate, using a lithographic projection apparatus and a patterning device and wherein the projecting results in a contrast loss for a spectrum of the beam; and
controlling the lithographic projection apparatus at least partially on the basis of a relative contrast loss and the patterning device, the relative contrast loss (RCL) determined by:

$$RCL = 1 - \int_\lambda C(\lambda) \times S(\lambda) d\lambda$$

where $S(\lambda)$ is a normalized spectrum of the radiation, $C(\lambda)$ is a normalized contrast function and $\lambda$ is wavelength of the radiation.

13. A machine readable storage medium according to claim 12, wherein the method further comprises inclining the substrate to a best image plane during the projecting.

14. A machine readable storage medium according to claim 13, wherein the method further comprises reducing the inclining when said relative contrast loss increases.

15. A machine readable storage medium according to claim 12, wherein the method comprises controlling a sigma setting of an illuminator used for the projecting at least partly on the basis of the relative contrast loss.

16. A machine readable storage medium according to claim 12, wherein the method comprises controlling spherical aberrations of a projection system used for the projecting at least partly on the basis of the relative contrast loss.

17. A machine readable storage medium having stored-machine executable instructions for performing a method comprising:
projecting a patterned beam of radiation onto a substrate, using a lithographic projection apparatus and a patterning device and wherein the projecting results in an average absolute detuning for a spectrum of the beam; and
controlling the lithographic projection apparatus at least partially on the basis of the average absolute detuning, the average absolute detuning (AAD) given by:

$$AAD = \int_\lambda |\lambda| \cdot S(\lambda) d\lambda$$

where $S(\lambda)$ is the normalized spectrum of the radiation and $\lambda$ is wavelength of the radiation.

18. A machine readable storage medium according to claim 17, wherein the method further comprises inclining the substrate to a best image plane during the projecting.

19. A machine readable storage medium according to claim 18, wherein the method further comprises reducing the inclining when said average absolute detuning increases.

20. A machine readable storage medium according to claim 17, wherein the method comprises controlling a sigma setting of an illuminator used for the projecting at least partly on the basis of the average absolute detuning.

21. A machine readable storage medium according to claim 17, wherein the method comprises controlling spherical aberrations of a projection system used for the projecting at least partly on the basis of the average absolute detuning.

* * * * *